Figure 1A:
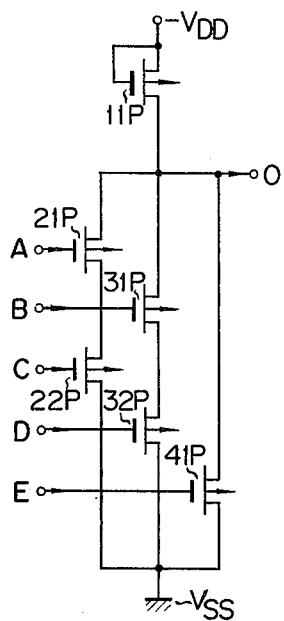

United States Patent [19]

Suzuki et al.

[11] 3,945,000
[45] Mar. 16, 1976

[54] SERIES LOGIC CIRCUIT ARRANGEMENT USING A PLURALITY OF COMPLEMENTARY IGFET'S

[75] Inventors: Yasoji Suzuki, Kanagawa; Kenshi Manabe, Musashino, both of Japan

[73] Assignee: Tokyo Shibaura Electric Co., Ltd., Japan

[22] Filed: July 30, 1974

[21] Appl. No.: 493,152

[30] Foreign Application Priority Data
July 13, 1973 Japan.................. 48-86159

[52] U.S. Cl............ 340/336; 307/205; 340/347 DD
[51] Int. Cl.²............................................ G08B 5/36
[58] Field of Search...... 340/336, 347 DD; 307/205, 307/213

[56] References Cited
UNITED STATES PATENTS

| | | | |
|---|---|---|---|
| 3,541,543 | 11/1970 | Crawford et al................. | 340/336 X |
| 3,717,868 | 2/1973 | Crawford et al............. | 340/347 DD |
| 3,760,380 | 9/1973 | Hoffman et al..................... | 307/313 |
| 3,820,108 | 6/1974 | Luce................................... | 340/336 |
| 3,825,888 | 7/1974 | Kawagoe...................... | 340/347 DD |

Primary Examiner—David L. Trafton
Attorney, Agent, or Firm—Cushman, Darby & Cushman

[57] ABSTRACT

A series logic circuit arrangement using a plurality of complementary IGFET's and comprising a plurality of series connected logic circuits, each of the logic circuits being designed to effect a predetermined logic function with respect to input binary coded signals by using at least one P channel IGFET and one N channel IFGET. In the negative logic system, the P channel IGFET's are arranged on a semiconductor substrate according to a logic equation of minterm-type expression, and the N channel IGFET's are arranged on the substrate according to a logic equation of maxterm-type expression, and, in the positive logic system, the N channel IGFET's are provided on the substrate according to the logic equation of minterm-type expression, and the P channel IGFET's are disposed on the substrate according to the logic equation of maxterm-type expression, thereby admitting of integrating the P and N channel IGFET's on the substrate within a smallest possible area.

4 Claims, 11 Drawing Figures

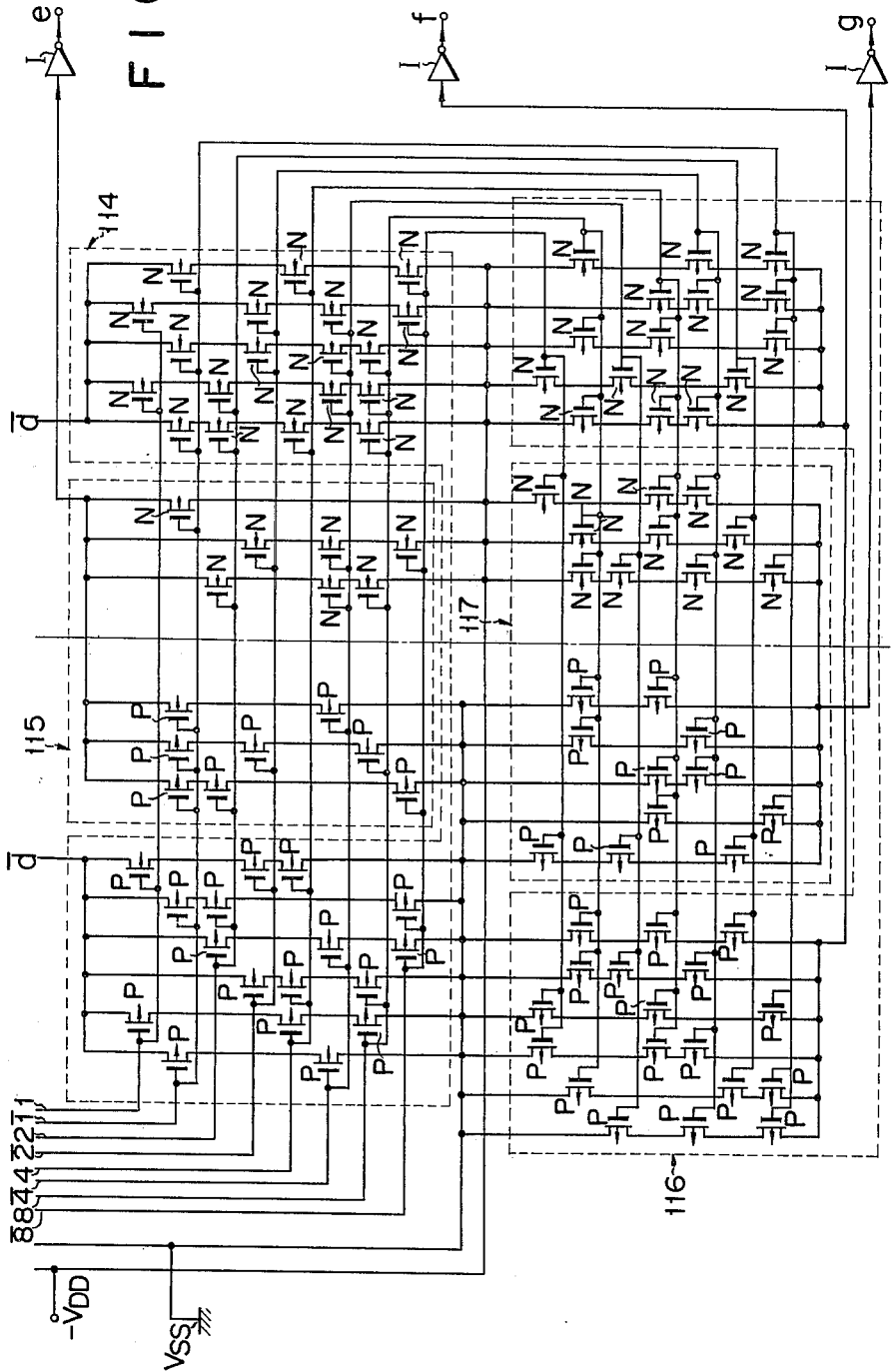

SERIES LOGIC CIRCUIT ARRANGEMENT USING A PLURALITY OF COMPLEMENTARY IGFET'S

This invention relates to a series logic circuit arrangement using a plurality of complementary metal oxide semiconductor or insulated gate field effect transistors (hereinafter abbreviated as "IGFET's") and more particularly to a series logic circuit arrangement so improved as to admit of large scale integration.

The above-mentioned type of series logic circuit arrangement practically used to date is exemplified, for example, by a three series or cascaded NAND (positive logic)NOR (negative logic) circuit arrangent in which three NOR circuits (or NAND circuits in the negative logic) are series connected in the form of NAND circuits (or NOR circuits in the negative logic) and are arranged to give forth an output satisfying a logic equation $0 = (A+C).(B+D).E$ in the positive logic with respect to five input binary coded signals A to E.

These types of prior art three series NANS/NOR circuit arrangement will now be described. The first type only comprises a plurality of (six in the case) IGFET's of the same channel (P channel in this case) which collectively constitute the first, second and third NOR circuits arranged parallel, as shown in FIG. 1A, between the output terminal O connected to the drain of a P channel load IGFET 11P whose gate and source are connected to a nongrounded negative D.C. source terminal $-V_{DD}$ and a grounded positive D.C. source terminal $V_{SS}$, such that said three NOR circuits respectively constitute NAND circuits with respect to the direction in which the input binary coded signals A to E are transmitted. The first NOR circuit comprises two P channel IGFET's 21P and 22P having drain-source paths connected in series to each other and gates impressed with the predetermined binary coded signals A and C respectively. The second NOR circuit comprises two P channel IGFET's 31P and 32P having drain-source paths connected in series and gates impressed with the predetermined binary coded signals B and D respectively. The third NOR circuit commprises one P channel IGFET 41P whose gate is impressed with the binary coded signal E and whose drain-source path is connected between the above-mentioned output terminal O and the grounded positive D.C. source terminal $V_{SS}$.

Figure 1C:
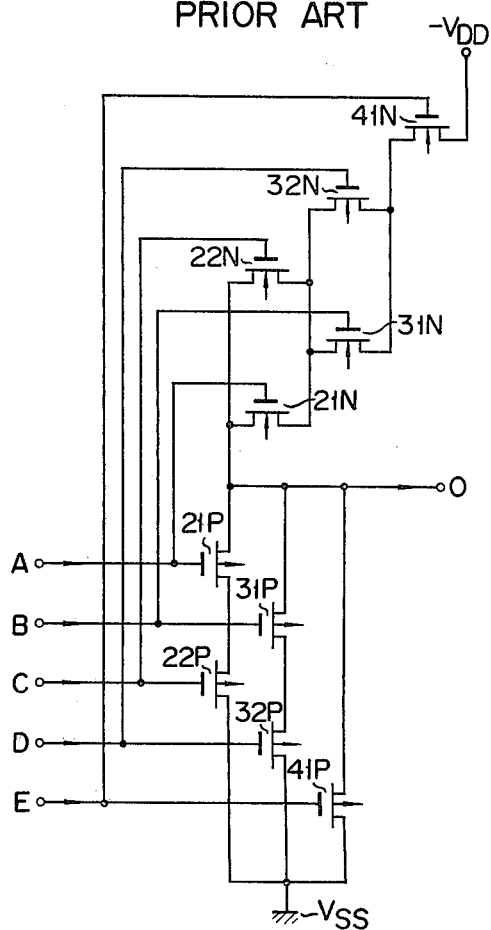
Figure 1B:
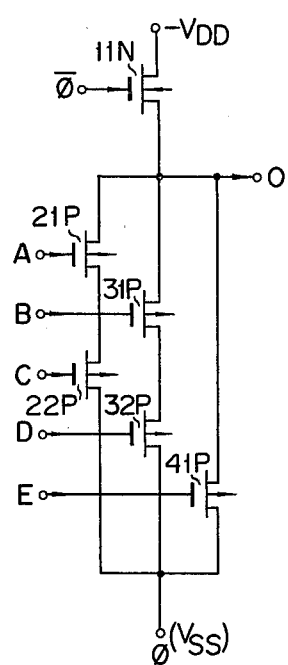

According to the second or so-called dynamic type of prior art three series NAND/NOR circuit arrangement shown in FIG. 1B, the positive side D.C. source terminal $V_{SS}$ which is not grounded is impressed with clock pulses $\phi$, and the P channel load IGFET of FIG. 1A is replaced by an N channel clock pulse controlled IGFET 11N which has a gate impressed with clock pulses $\bar{\phi}$ having a phase inverted from the above-mentioned clock pulses $\phi$ and a drain-source path connected between the output terminal O and the negative D.C. source terminal $-V_{DD}$.

According to the third or so-called static type of prior art three series NAND/NOR circuit arrangement shown in FIG. 1C, the P channel load IGFET 11P of FIG. 1A is replaced by N channel IGFET's 21N, 22N, 31N, 32N and 41N provided in the same number as the aforesaid P channel IGFET's 21P, 22P, 31P, 32P and 41P and constituting the so-called complementary symmetric pairs therewith. The gates of these N channel IGFET's are impressed with the corresponding binary coded signals A to E. The N channel IGFET's 21N–22N and 31N–32N respectively have their drain-source paths connected in parallel, in contrast to the series-connected drain-source paths of the corresponding P channel IGFET's 21P–22P and 31P–32P. The parallel connected drain-source paths of the N channel IGFET's 21N–22N, the parallel connected drain-source paths of the N channel IGFET's 31N–32N and the drain-source path of the N channel IGFET 41N are connected in series between the output terminal O and the negative D.C. source terminal $-V_{DD}$.

The same parts of FIGS. 1B and 1C as those of FIG. 1A are denoted by the same numerals and description thereof is omitted.

However, the first type of prior art series logic circuit arrangement of FIG. 1A comprising a plurality of IGFET's of the same channel which includes the load IGFET 11P has the drawback that it consumes a great deal of power, as is well known and in consequence is unadapted to be integrated particularly for a large capacity, though said arrangement requires only half the number of IGFET's used in the third type series logic circuit arrangement of FIG. 1C comprising a plurality of complementary symmetric pairs of IGFET's.

The dynamic type series logic circuit arrangement of FIG. 1B using the clock pulse controlled IGFET 11N has the advantage of well serving the purpose simply by using the same number of IGFET's as the type of FIG. 1A and moreover with far less power consumption. However, where it is difficult from the standpoint of circuit design to provide a timing pulse source for generation of clock pulses $\phi$ and $\bar{\phi}$, and/or where it is impossible to apply a dynamic type only effective for quicker operation than a certain level, then the dynamic type series logic circuit arrangement of FIG. 1B has the drawback of being unavailable for practical application.

The prior art static type series logic circuit arrangement of FIG. 1C using a plurality of complementary symmetric pairs of IGFET's indeed has the advantage of consuming far less power than the type of FIG. 1A using the load IGFET 11P, eliminating the necessity of providing a timing pulse source as in the dynamic type series logic circuit arrangement of FIG. 1B comprising a clocked IGFET 11N, and being adaptable for any operating speed. But the prior art circuit arrangement of FIG. 1C has the drawbacks that it requires about twice as many IGFET's as those used in FIGS. 1A and 1B, and that as apparent from FIG. 2, IGFET's belonging to either of the P and N channel types (N channel IGFET's in this case) have to be arranged on a semiconductor substrate at a considerable space, though the IGFET's of the other channel type (P channel type in this case) may be provided on said substrate as densely as possible, thus necessitating the provision of an appreciably large semiconductor substrate, where numerous IGFET's have to be integrated and in consequence rendering bulky the apparatus using such a substrate bearing integrated numerous semiconductor elements.

Figure 2:
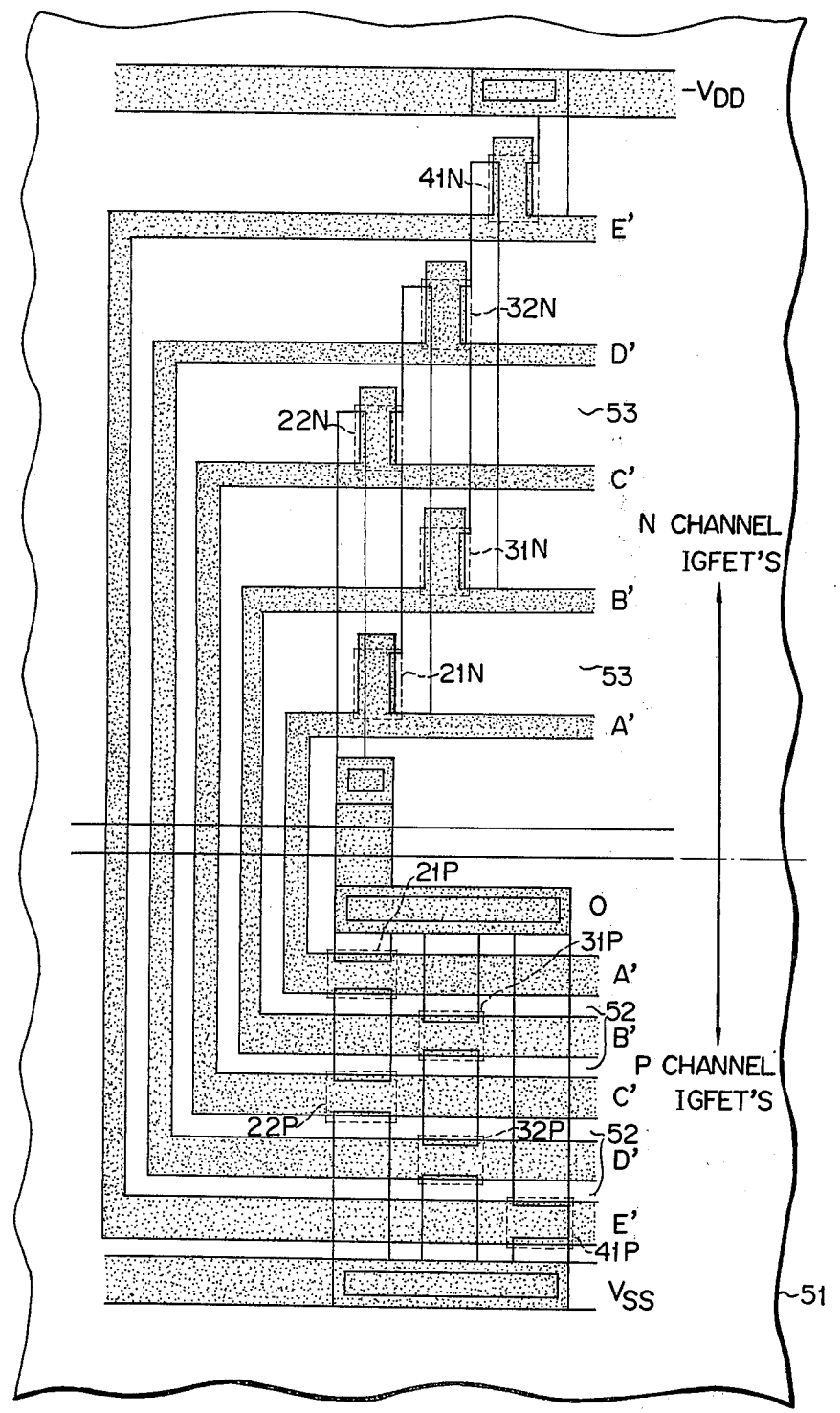

FIG. 2 schematically shows the pattern of the circuit arrangement of FIG. 1C integrated on a semiconductor substrate 51. As seen from FIG. 2, the P channel IGFET's 21P, 22P, 31P, 32P and 41P whose drain-source paths are disposed in a direction perpendicular to that in which the input binary coded signals A to E are transmitted, namely, in a direction connecting the negative and positive D.C. source terminals $-V_{DD}$ and $V_{SS}$ can be provided right below the passageways $A'$ to $E'$ of said binary coded signals A to E, easily admitting of as dense as integration as possible on the semiconductor substrate or ship 51 with said passageways A' to E' spaced from each other only at as small an interval 52 as possible, insofaras short-circuiting does not take place across the adjacent ones of said passageways A' to E'.

In contrast, the N channel IGFET's 21N, 22N, 31N, 32N and 41N of FIG. 1C have the drain-source paths disposed in the direction in which the input binary coded signals A to E are transmitted, namely, in a direction perpendicular to that which connects the negative and positive D.C. source terminals $-V_{DD}$ and $V_{SS}$ and should be provided, as shown in FIG. 2, between the respective passageways A' to E', making it necessary to allow an appreciably wide space 53 therebetween. Therefore, the aforesaid N channel IGFET's 21N, 22N, 31N, 32N and 41N fail to be integrated on the semiconductor substrate 51 so densely as the P channel IGFET's 21P, 22P, 31P, 32P and 41P, thus requiring the provision of a considerably large semiconductor substrate.

It is accordingly the object of this invention to provide a series logic circuit arrangement using a plurality of complementary IGFET's, all of which can be easily integrated on a semiconductor substrate or ship as densely as possible.

A series logic circuit arrangement according to this invention comprising a plurality of complementary or P and N channel IGFET's is characterized by easily eliminating the above-mentioned technical difficulties of integration accompanying the prior art series logic circuit arrangement using a plurality of complementary symmetric pairs of IGFET's due to circuit arrangements based on different logic equations being provided for the P and N channel IGFET sections.

Figure 3:
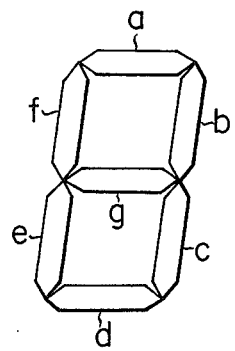
Figure 4:
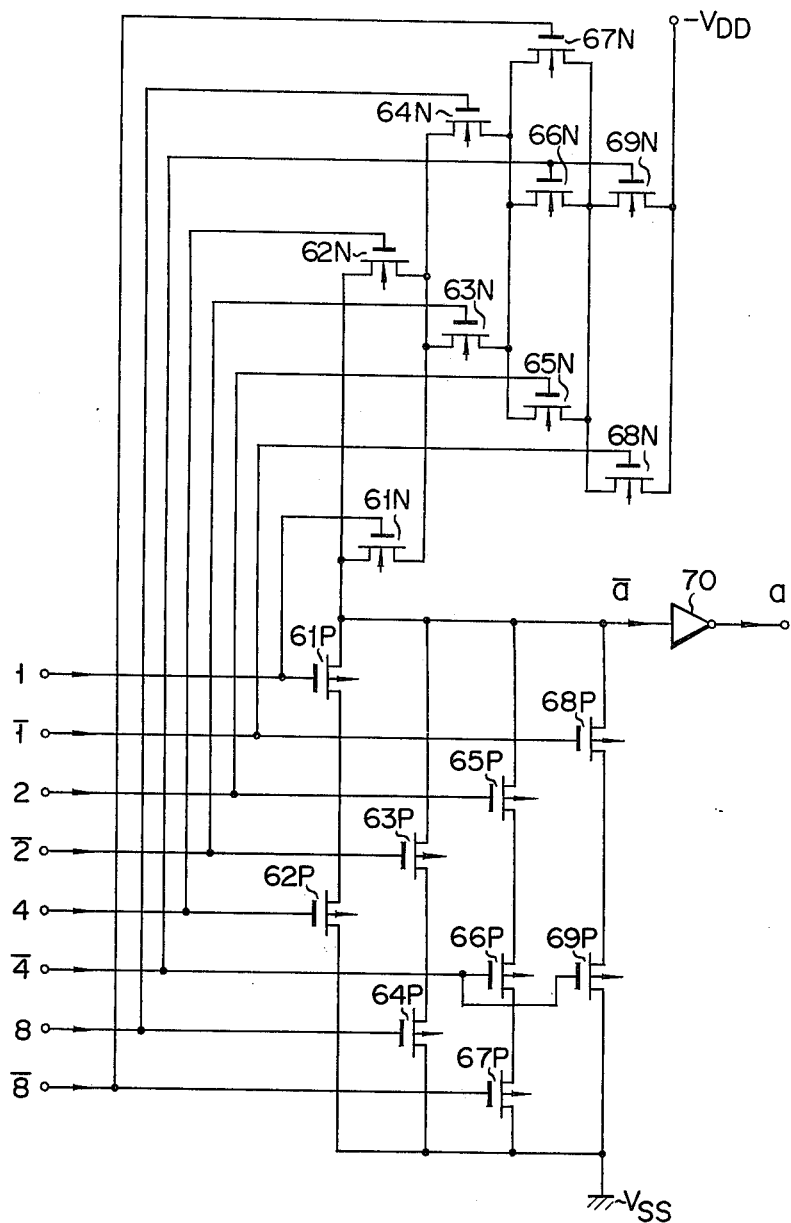
Figure 5:
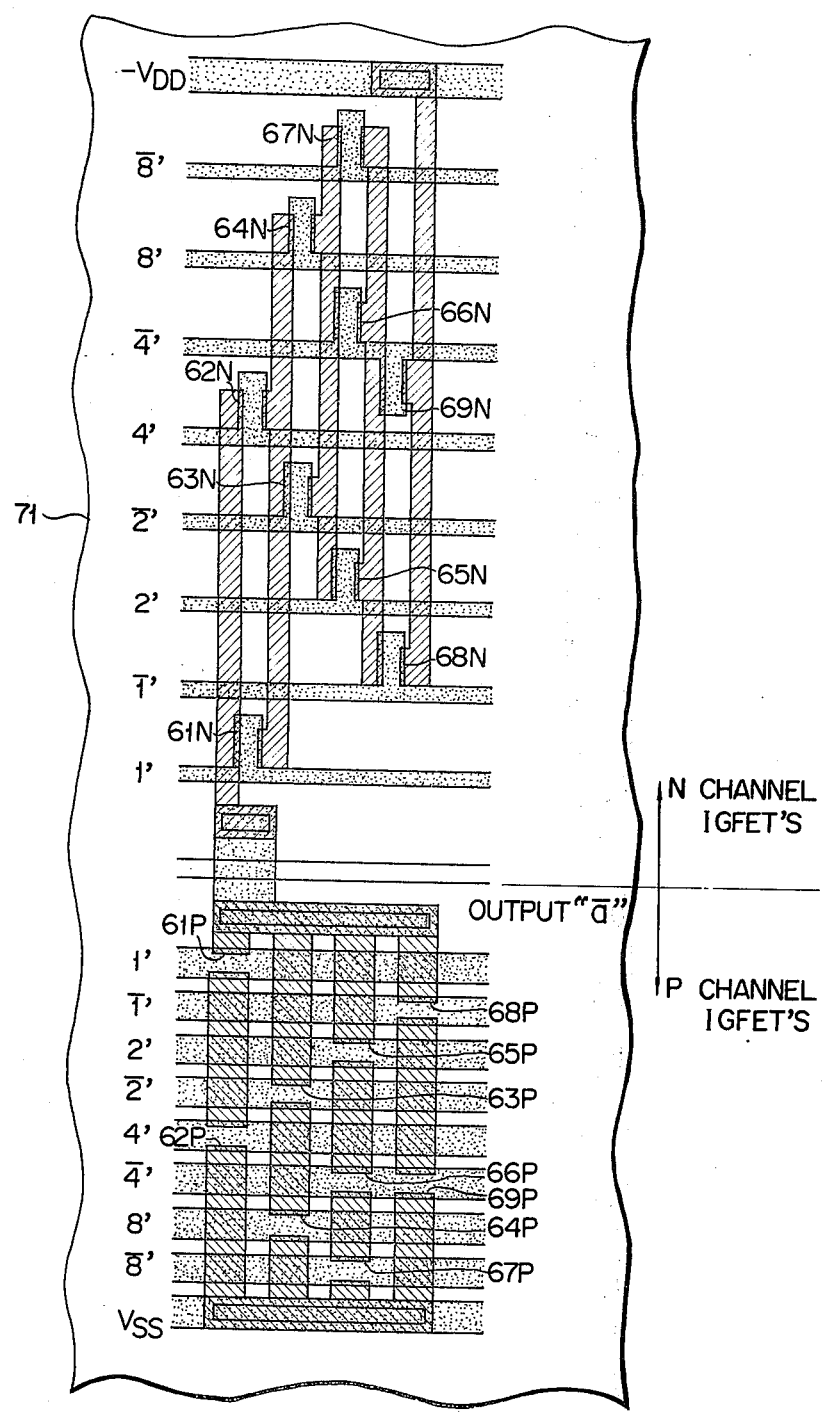
Figure 6:
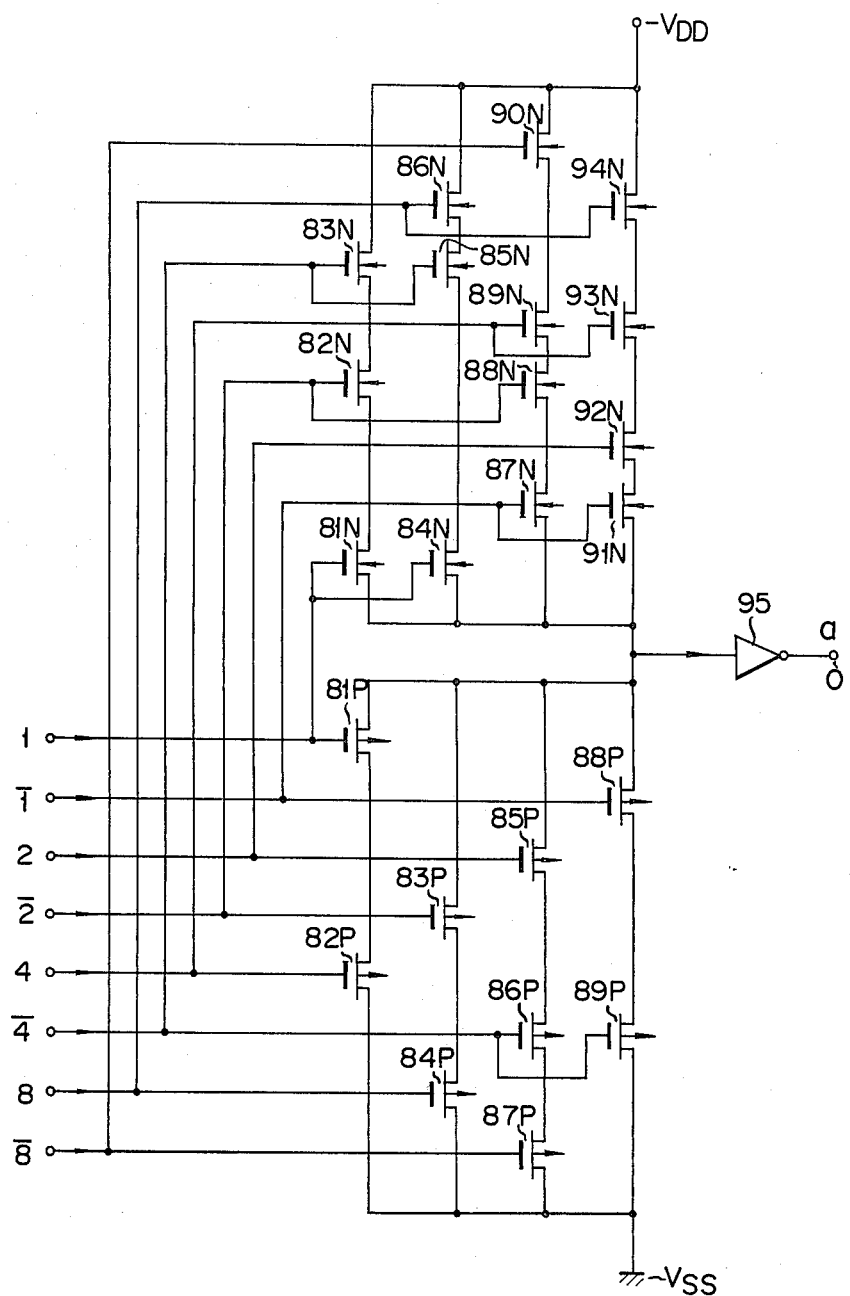
Figure 7:
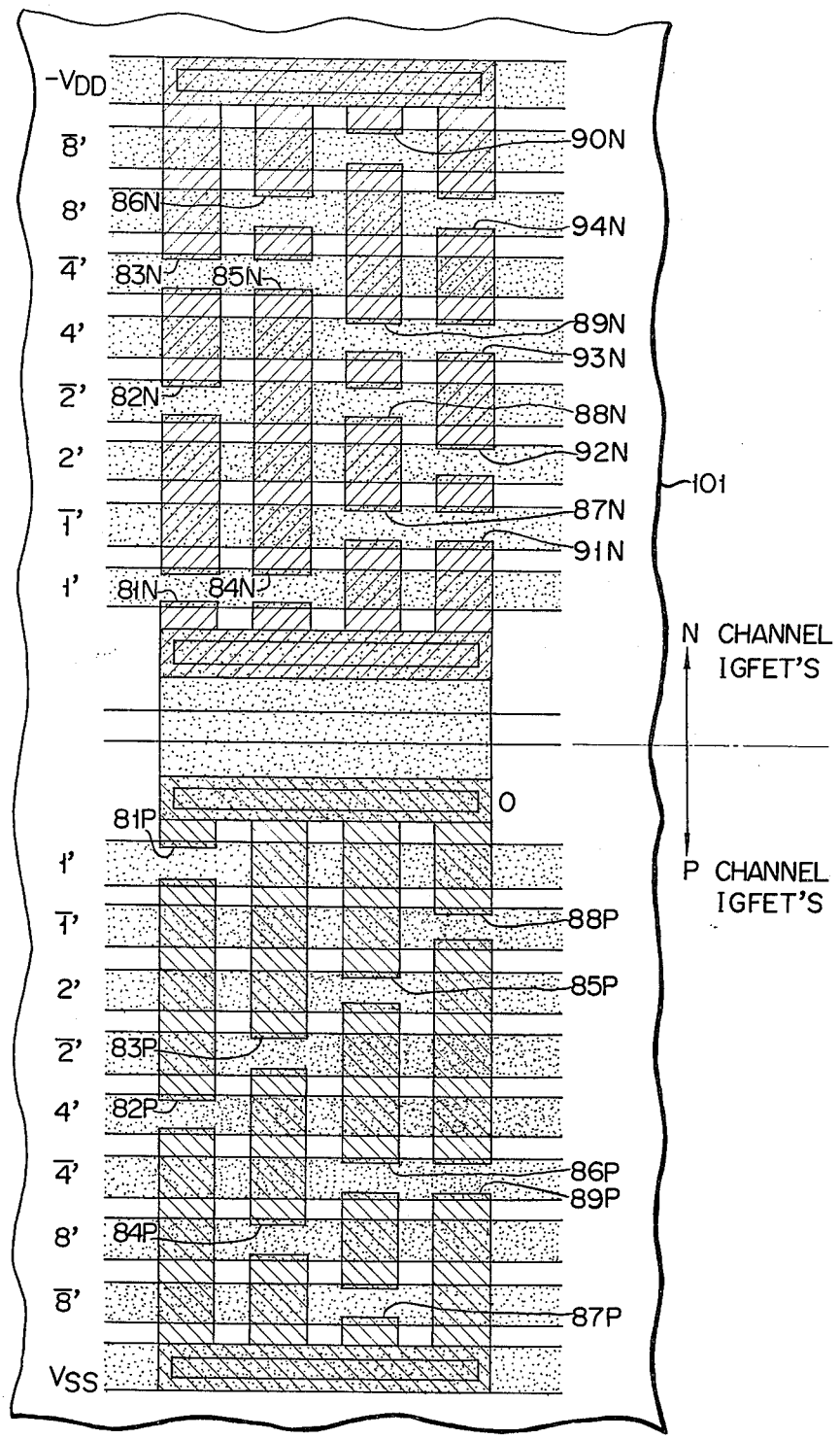
Figure 8A:
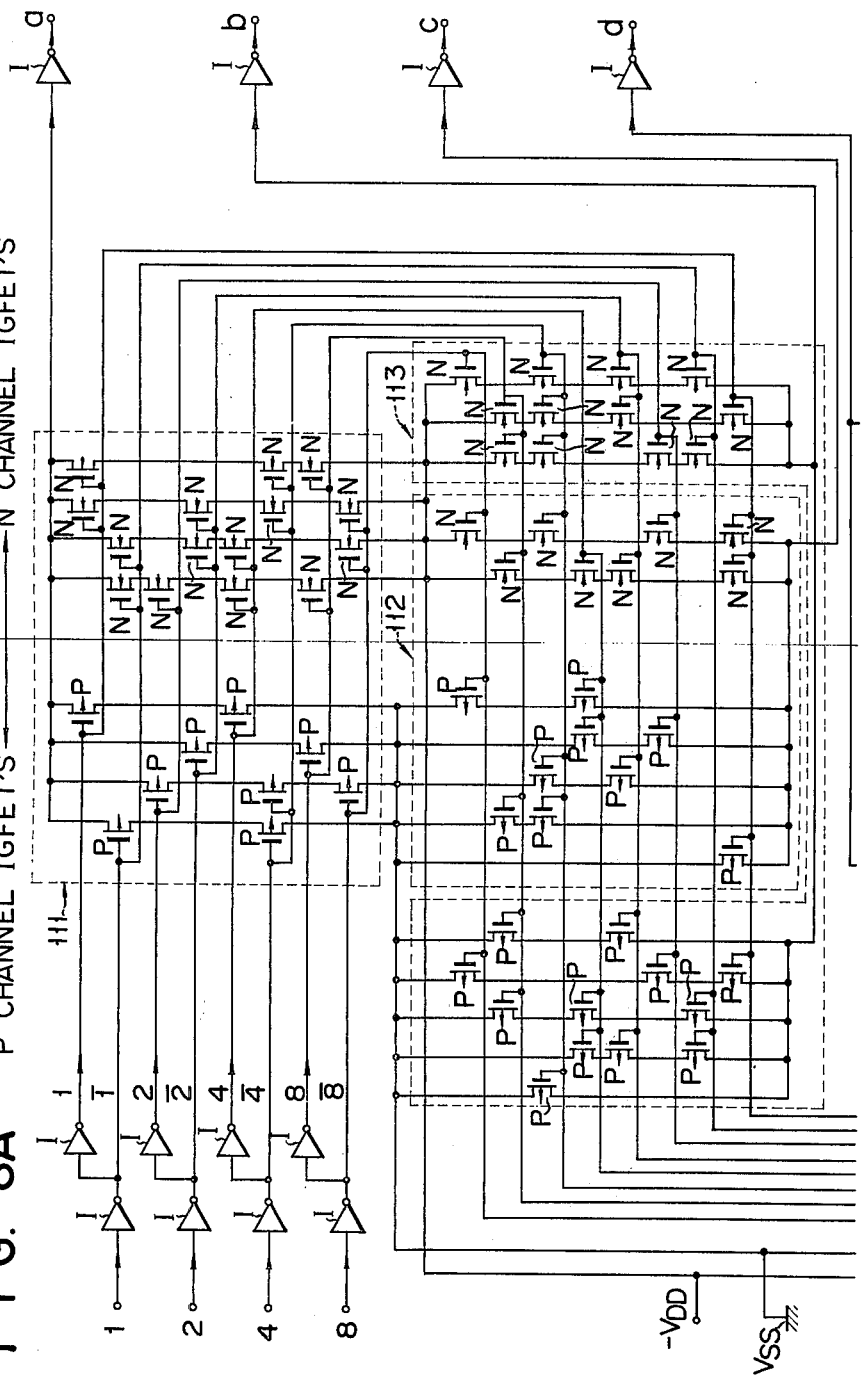

This invention can be more fully understood from the following detailed description when taken in conjunction with the accompanying drawings, in which:

FIGS. 1A to 1C show the practical prior art three series NAND/NOR circuit arrangements each using a plurality of IGFET's;

FIG. 2 schematically shows the pattern of the prior art circuit arrangement of FIG. 1C integrated on a semiconductor substrate;

FIG. 3 illustrates the arrangement of the display segments of a digit display device capable of freely indicating digits of 0 to 9;

FIG. 4 indicates the practical prior art series logic circuit arrangement comprising a plurality of complementary symmetric pairs of IGFET's designed to select the display segment a of FIG. 3;

FIG. 5 schematically shows the pattern of the circuit arrangement of FIG. 4 integrated on a semiconductor substrate;

FIG. 6 shows the practical series logic circuit arrangement of this invention comprising a plurality of complementary IGFET's designed to select the display segment a of FIG. 3;

FIG. 7 schematically shows the pattern of the circuit arrangement of FIG. 6 integrated on a semiconductor substrate; and FIGS. 8A and 8B jointly show the practical circuit diagram of the series logic circuit arrangement of this invention designed to select any of all the display segments a to g to FIG. 3.

The series logic circuit arrangement of this invention will now be described with reference, for convenience of description, to a concrete example of a decoder, though this invention is not limited thereto. This decoder is designed to select any of the seven display segments a to g of a digit display device of FIG. 3 capable of freely indicating any of the digits 0 to 9 by a predetermined logical combination of input signals representing binary coded decimals (hereinafter abbreviated as "BCD").

A logic equation for selecting any of the seven display segments a to g formed in a substantially "8" shape as shown in FIG. 3, for example, the segment a by an appropriate logical combination of input BCD signals is generally indicated by the following logic equation of minterm-type expression:

$$a = (1.4) + (\overline{2}.8) + (2.\overline{4}.8) + (\overline{1.4}) \qquad (1)$$

FIG. 4 shows the practical circuit arrangement of the prior art decoder apparatus comprising nine complementary symmetric pairs of IGFET's 61P—61N, 62P—62N, 63P—63N, 64P—64N, 65P—65N, 66P—66N, 67P—67N, 68P—68N and 69P—69N. In FIG. 4 reference numeral 70 denotes as inverter, through which a logic output a satisfying the above equation (1) is drawn out at the output terminal O. FIG. 5 schematically illustrates the pattern of the circuit arrangement of FIG. 4 integrated on a semiconductor substrate or chip 71. As seen from FIG. 5, the P channel IGFET's 61P to 69P can be disposed, as clear from the above description, right below the corresponding ones of the passageways 1', $\overline{1}'$, 2', $\overline{2}'$, 4', $\overline{4}'$, 8', $\overline{8}'$ of input BCD signals, admitting of as dense an integration as possible on the substrate 71. In constrast, the N channel IGFET's 61N to 69N which have to be provided, as above-mentioned, between the respective passageways of the input BCD signals should be integrated on the substrate 71 at an appreciably larger space than the P channel IGFET's 61P to 69P, undesirably requiring the semiconductor substarte 71 to be considerably enlarged in size.

According to this invention, therefore, the prior art series logic circuit arrangement is modified such that the drain-source paths of all the P and N channel IGFET's are positioned in a direction perpendicular to respective passageways 1', $\overline{1}'$, 2', $\overline{2}'$, 4', $\overline{4}'$, 8', $\overline{8}'$ of the input BCD signals being disposed on a semiconductor substrate, namely, in a direction connecting the negative and positive D.C. source terminals $-V_{DD}$ and $V_{SS}$ so as to be integrated on the substrate as densely as possible.

Namely, the P channel IGFET section comprises nine P channel IFGET's 81P to 89P arranged, as shown in FIG. 6, according to the logic equation (1) of minterm-type expression, and the N channel IGFET section comprises fourteen N channel IGFET's 81N to 94N arranged according to a logic equation of maxterm-type expression equivalent to the above-mentioned logic equation of minterm-type expression. In other words, said logic equation (1) of minterm-type expression can be converted into the following equivalent logic equation of maxterm-type expression:

$$a = (1+\overline{2}+\overline{4}).(1+\overline{4}+8).(\overline{1}+\overline{2}+4+\overline{8}).(\overline{1}+2+4+8) \qquad (2)$$

Reference numeral 95 of FIG. 6 denotes an inverter, through which a logic output a satisfying the above equations (1) and (2) is drawn out at the output terminal O.

FIG. 7 schematically shows the pattern of the circuit arrangement of FIG. 6 integrated on a semiconductor substrate 101. As apparent from FIG. 7, not only all the P channel IGFET's 81P to 89P but also all the N channel IGFET's 81N to 89N can be disposed right below the corresponding ones of the passageways $1'$, $\overline{1}'$, $2'$, $\overline{2}'$, $4'$, $\overline{4}'$, $8'$, $\overline{8}'$ of the input BCD signals, easily admitting of as dense an integration as possible on the semiconductor substrate 101. As apparent from FIGS. 5 and 7, therefore, the decoder apparatus of this invention arranged as shown in FIG. 6 enables all the P and N channel IGFET's to be integrated on a much smaller semiconductor substrate then in the prior art decoder apparatus, advantageously minimizing the size of various electrical apparatuses using the present decoder apparatus.

FIGS. 8A and 8B jointly show the practical circuit arrangement of the BCD to 7-segment decoder apparatus of this invention in which, as in FIG. 6, all of the P channel IGFET's are arranged according to the logic equation of mintermtype expression and all the N channel IGFET's are provided according to the logic equation of maxterm-type expression so as to select any of the seven display segments $a$ to $g$ of a digit display device of FIG. 3 capable of freely indicating any of the digits 0 to 9 by a prescribed logic combination of the input BCD signals $1$, $\overline{1}$, $2$, $\overline{2}$, $4$, $\overline{4}$, $8$, $\overline{8}$. Namely, the section 111 of the circuit arrangement of FIGS. 8A and 8B for selecting the display segment $a$ of the seven display segments $a$ to $g$ of FIG. 3 comprises nine P channel IGFET's and 14 N channel IGFET's (see FIG. 6). The section 112 for selecting the display segment b comprises 12 P channel IGFET's and also 12 N channel IGFET's. The section 113 for selecting the display segment $c$ is formed of nine P channel IGFET's and eight N channel IGFET's. The section 114 for selecting the display segment $d$ comprises 17 P channel IGFET's and 19 N channel IGFET's. The section 115 for selecting the display segment $e$ is formed of eight P channel IGFET's and seven N channel IGFET's. The section 116 for selecting the display segment $f$ comprises 18 P channel IGFET's and 15 N channel IGFET's. The section 117 for selecting the display segment $g$ comprises 11 P channel IGFET's and 10 N channel IGFET's.

The reference symbols P, N and I of FIGS. 8A and 8B denote P channel IGFET's, N channel IGFET's and inverters respectively. As seen from FIGS. 8A and 8B, a considerably large number of P and N channel IGFET's are required to provide a decoder apparatus capable of freely selecting any of the seven display segments $a$ to $g$ of the digit display device of FIG. 3 indicating digits of 0 to 9 by a prescribed logic combination of the input BCD signals. Therefore, in the case of an apparatus using a device designed to display a numerical value comprising a plurality of digits such as a desk electronic computer or digital clock, the most vital technical problem in miniaturizing such apparatus rests with a method of reducing the size of a semiconductor substrate on which all the P and N channel IGFET's are to be integrated. From this point of view, a prominent technical effect can be attained by the series logic circuit arrangement of this invention enabling all the P and N channel IGFET's constituting any desired logic circuits to be integrated on a semiconductor substrate as densely as possible.

This invention is not limited to the above-mentioned series logic circuit arrangement, but is obviously applicable to all other apparatuses that are derived from substantially the same technical concept as underlies the invention. Namely, though the series logic circuit arrangements of this invention shown in FIG. 6 and 8 were based on the negative logic system in which the P channel IGFET's were arranged according to a logic equation of minterm-type expression and the N channel IGFET's according to a logic equation of maxterm-type expression, yet the same effect can be attained, as easily understood by those skilled in the art, by applying the positive logic system in which, conversely from the above-mentioned case, the N channel IGFET's are provided according to the logic equation of minterm-type expression and the P channel IGFET's according to the logic equation of maxterm-type expression.

What we claim is:

1. In a series logic circuit arrangement using a plurality of P and N channel IGFET's and comprising a plurality of series logic circuits to which a plurality of input binary coded signals are applied, each of said logic circuits being designed to effect a predetermined logic function with respect to any ones of the plurality of input binary coded signals by using at least one P channel IGFET and one N channel IGFET, the improvement in that said P channel IGFET's and N channel IGFET's are arranged according to positive and negative logic systems with respect to the plurality of input binary coded signals, in the negative logic system, said P channel IGFET's being arranged according to a logic equation of minterm-type expression and said N channel IGFET's according to a logic equation of maxterm-type expression, and, in the positive logic system, said P channel IGFET's being provided according to a logic equation of maxterm-type expression and said N channel IGFET's according to a logic equation of minterm-type expression.

2. In a series logic circuit arrangement claimed in claim 1, the further improvement in that said P channel IGFET's and N channel IGFET's are all integrated on a semiconductor substrate right below the corresponding passageways of the plurality of input binary coded signals disposed on said substrate.

3. In a series logic circuit arrangement claimed in claim 1, which constitutes a decoder apparatus designed to give forth a decoded logic output bearing a predetermined relationship with a plurality of input binary coded signals.

4. In a series logic circuit arrangement claimed in claim 3, the further improvement in that said decoder apparatus comprises a binary coded decimals to 7-segment decoder apparatus designed to select any segment of a digit display device which is constituted by 7-segments formed in a substantially 8-shape capable of indicating any of the digits of 0 through 9 in accordance with a predetermined logic combination of a plurality of input binary coded decimal signals.

* * * * *